(12) United States Patent
Yamasaki et al.

(10) Patent No.: US 7,161,242 B2
(45) Date of Patent: Jan. 9, 2007

(54) SEMICONDUCTOR DEVICE, SEMICONDUCTOR DEVICE SUBSTRATE, AND MANUFACTURING METHOD THEREOF THAT CAN INCREASE RELIABILITY IN MOUNTING A SEMICONDUCTOR ELEMENT

(75) Inventors: Tomoo Yamasaki, Nagano (JP); Akio Rokugawa, Nagano (JP); Akihito Takano, Nagano (JP); Kiyoshi Ooi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 37 days.

(21) Appl. No.: 10/800,603

(22) Filed: Mar. 15, 2004

(65) Prior Publication Data
US 2004/0183187 A1  Sep. 23, 2004

(30) Foreign Application Priority Data
Mar. 17, 2003  (JP) ............................. 2003-072755

(51) Int. Cl.
*H01L 23/34*  (2006.01)

(52) U.S. Cl. ............................... 257/724; 257/E27.111

(58) Field of Classification Search ............... 257/686, 257/724
See application file for complete search history.

(56) References Cited

U.S. PATENT DOCUMENTS

| | | | |
|---|---|---|---|
| 6,407,929 B1 * | 6/2002 | Hale et al. | 361/763 |
| 6,737,742 B1 * | 5/2004 | Sweterlitsch | 257/723 |
| 2002/0100611 A1 * | 8/2002 | Crockett et al. | 174/261 |

FOREIGN PATENT DOCUMENTS

JP     2001-274034     10/2001

* cited by examiner

*Primary Examiner*—Evan Pert
*Assistant Examiner*—Benjamin P. Sandvik
(74) *Attorney, Agent, or Firm*—Ladas & Parry LLP

(57) ABSTRACT

A semiconductor device substrate includes a substrate body having a wiring layer. A base is formed by a material that is different from a material of the substrate body. The base supports the substrate body, and has an opening forming portion where a semiconductor element is mounted. A reinforcing member is larger than the opening forming portion, provided in the substrate body at a portion corresponding to the opening forming portion, and reinforces the substrate body at the portion corresponding to the opening forming portion.

18 Claims, 10 Drawing Sheets

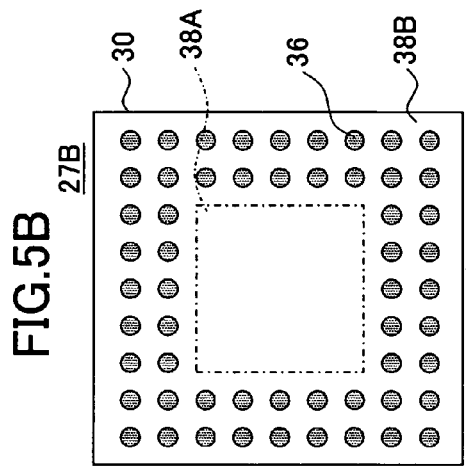
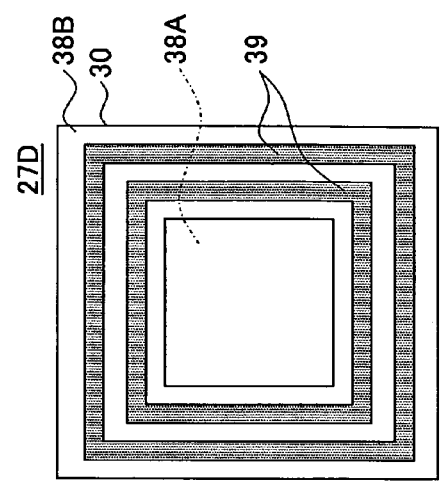
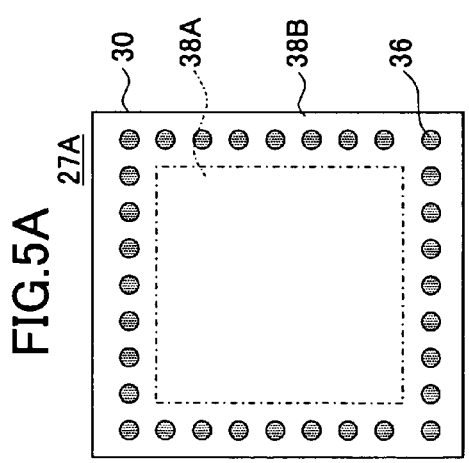
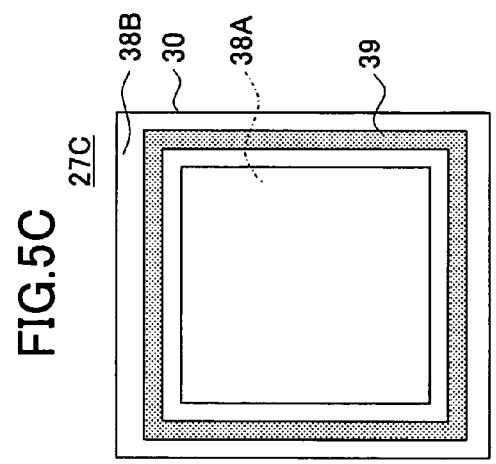

SEMICONDUCTOR DEVICE, SEMICONDUCTOR DEVICE SUBSTRATE, AND MANUFACTURING METHOD THEREOF THAT CAN INCREASE RELIABILITY IN MOUNTING A SEMICONDUCTOR ELEMENT

BACKGROUND OF THE INVENTION

1. Field of the Invention

The present invention generally relates to semiconductor device substrates (substrates for semiconductor devices) and manufacturing methods thereof, and more particularly, to a semiconductor device substrate including a substrate body having a wiring layer, and a base supporting the substrate body and having an opening at a position where a semiconductor device is mounted, and to a manufacturing method of the semiconductor device substrate.

2. Description of the Related Art

Recently, with the increase in the operating frequency of semiconductor elements mounted on semiconductor devices, it becomes necessary to stabilize a power supply voltage supplied to the semiconductor element. In order to meet such a need, there is proposed a structure in which a capacitor element is provided in a semiconductor device substrate (substrate for a semiconductor device) on which a semiconductor element is mounted (refer to Japanese Laid-Open Patent Application No. 2001-274034, for example).

FIG. 1 shows a conventional semiconductor device 1 having a capacitor element and a semiconductor device substrate 3 (hereinafter simply referred to as a "substrate 3"). In the semiconductor device 1, a semiconductor element 2 is mounted in an opening 9 formed in the substrate 3.

The substrate 3 is constructed by a substrate body 5, a base 6, a circuit board 7, and the like. The substrate body 5 is formed on a surface of the base 6 by a build-up method. Vias 8 are formed in the substrate body 5, which is formed by an insulating resin member 16, such that the vias 8 penetrate the substrate body 5 in the longitudinal direction of FIG. 1.

The base 6 is provided for supporting the substrate body 5. Hence, the base 6 is formed by a metal (copper, for example) having a greater mechanical strength than that of the substrate body 5. The opening 9 is formed at a device mounting position of the base 6 where the semiconductor element 2 is mounted.

The circuit board 7 is mounted on the substrate body 5 with a part of the circuit board 7 embedded therein. The circuit board 7 is constructed by a silicon core 10 and a capacitor forming part 12 formed on the top surface of the silicon core 10. Core penetration vias 14, which penetrate the silicon core 10, are formed under the capacitor forming part 12. Bumps 13 for making connection with the semiconductor element 2 are formed on the capacitor forming part 12.

The semiconductor element 2 is flip-chip bonded to the bumps 13 via solder bumps 4. The core penetration vias 14 are connected with the vias 8 formed in the substrate body 5. Consequently, the capacitor forming part 12 is positioned between the semiconductor element 2 and the vias 8 (vias for power supply/grounding). With the capacitor element formed in the capacitor forming part 12, it is possible to stabilize power supply voltage supplied to the semiconductor element 2.

FIGS. 2A, 2B, and 2C show a conventional manufacturing method of the substrate 3. When manufacturing the substrate 3, the circuit board 7 is manufactured in advance in which circuit board 7 the capacitor forming part 12, the bumps 13, and the core penetration vias 14 are formed on the silicon core 10. As shown in FIG. 2A, the circuit board 7 is provided on the base 6 in which the opening 9 is not formed. On this occasion, the circuit board 7 is fixed to the base 6 by using an adhesive material 15.

Subsequently, as shown in FIG. 2, the substrate body 5 is formed by stacking the vias 8, a wiring pattern (not shown), and the insulating resin member 16 by using a build-up method. As a result, the circuit board 7 is embedded in the substrate body 5.

Then, as shown in FIG. 2C, the opening 9 is formed in the base 6 at the mounting position of the semiconductor element 2. The region where the opening 9 is formed is set such that the region where the circuit board 7 is formed is included therein. That is, the size of the opening 9 is set larger than that of the circuit board 7.

As mentioned above, by forming the opening 9 in the base 6, the bumps 13 of the circuit board 7 are exposed. Accordingly, it becomes possible to mount the semiconductor element 2 on the substrate 3.

As mentioned above, the substrate body 5 constituting a part of the substrate 3 is formed mainly by resin. On the other hand, the base 6 is formed by a metal such as cooper. Accordingly, due to the difference in thermal expansion coefficients between the substrate body 5 and the base 6, stress is generated between the substrate body 5 and the base 6 in a heating process (heating for solidifying the adhesive material 15) performed when arranging the circuit board 7 on the base 6 via the adhesive material 15, and in another heating process (heating for forming the insulating resin member 16) performed when forming the substrate body 5.

Before the opening 9 is formed in the base 6, the substrate body 5 is supported by the base 6. Hence, the substrate 3 is not deformed by the stress generated between the substrate body 5 and the base 6. However, as shown in FIG. 2C, when the opening 9 is formed in the base 6, the substrate body 5 is not supported by the base 6 at the portion where the opening 9 is formed. Hence, the substrate body 5 is deformed by the above-mentioned stress.

When the substrate body 5 is deformed as mentioned above, since the size of the circuit board 7 is conventionally smaller than that of the opening 9, the circuit board 7 is shifted from a predetermined position as shown in FIGS. 1 and 2C. Hence, there is a problem in that the semiconductor element 2 is not suitably mounted.

Specifically, in the case shown in FIG. 1, the circuit board 7 is inclined, which separates the right-most vias 8 and the solder bump 4. Thus, in the semiconductor device 1 having the conventional configuration, there is a problem in that poor electrical connection may be made between the semiconductor element 2 and the substrate 3, and reliability of the semiconductor device 1 is significantly degraded.

It should be noted that the circuit board 7 is conventionally made smaller than the opening 9 since a power supply electrode (terminal) and a ground electrode (terminal) provided in the semiconductor element 2 are generally arranged in the center portion of the semiconductor element 2. In other words, it is necessary to connect the capacitor forming part 12 formed in the circuit board 7 to the power supply electrode and the ground electrode of the semiconductor element 2. Thus, it is conceived that, in order to stabilize the power supply, which is the original object, arranging the circuit board 7 to face the center portion of the semiconductor element 2 where the power supply electrode and the ground electrode are provided will suffice, and it is unnecessary to further increase the size of the circuit board 7.

SUMMARY OF THE INVENTION

A general object of the present invention is to provide an improved and useful semiconductor device, semiconductor device substrate, and manufacturing method thereof in which one or more of the above-mentioned problems are eliminated.

Another and more specific object of the present invention is to provide a semiconductor device, a semiconductor device substrate, and a manufacturing method thereof that offers reliable mounting of a semiconductor element.

In order to achieve the above-mentioned objects, according to one aspect of the present invention, there is provided a semiconductor device substrate including:

a substrate body having a wiring layer;

a base formed by a material that is different from a material of the substrate body, supporting the substrate body, and having an opening forming portion where a semiconductor element is mounted; and a reinforcing member larger than the opening forming portion, provided in the substrate body at a portion corresponding to the opening forming portion, and reinforcing the substrate body at the portion corresponding to the opening forming portion.

According to the above-mentioned aspect of the present invention, even if the opening (opening forming portion) is formed in the base, the substrate body is reinforced by the reinforcing member in the portion corresponding to the opening. Hence, it is possible to prevent the substrate body from being deformed at the portion corresponding to the opening.

Additionally, in the above-mentioned semiconductor device substrate, the reinforcing member may be a circuit board having a capacitor part that electrically connects the semiconductor element and the wiring layer.

Accordingly, by using as the reinforcing member the circuit board having the capacitor part therein that electrically connects the semiconductor element and the wiring layer, when the semiconductor element is mounted in the opening, the circuit board (reinforcing member) is not inclined since the substrate body is not deformed. Thus, it is possible to positively connect the semiconductor element and the circuit board. In addition, by using the circuit board as the reinforcing member, it is possible to reduce the number of components compared to the case where the circuit board and a reinforcing member are separately provided.

Additionally, the reinforcing member may be an interposer having a via formed therein that directly electrically connects the semiconductor element and the wiring layer.

Accordingly, by using as the reinforcing member the interposer having a via that directly electrically connects the semiconductor element and the wiring layer, when the semiconductor element is mounted in the opening, the interposer (reinforcing member) is not inclined since the substrate body is not deformed. Thus, it is possible to positively connect the semiconductor element and the interposer. In addition, by using the interposer as the reinforcing member, it is possible to reduce the number of components compared to the case where the interposer and a reinforcing member are separately provided.

Additionally, the reinforcing member may be arranged on the base via an abutting member made of a metal.

Accordingly, since the reinforcing member is arranged on the base via the abutting member made of a metal, heat generated in the semiconductor element is transferred to the base via the reinforcing member and the abutting member made of the metal. Hence, it is possible to increase the heat radiation efficiency of the semiconductor element.

According to another aspect of the present invention, there is provided a manufacturing method of a substrate, the manufacturing method including the steps of:

manufacturing a reinforcing member;

arranging the reinforcing member on a base at a portion corresponding to an opening forming portion of the base;

forming a substrate body on the base on which the reinforcing member is arranged, the substrate body including a wiring layer and made of a material that is different from a material of the base; and forming the opening forming portion smaller than the reinforcing member, thereby exposing a part of the reinforcing member at the opening forming portion.

According to the above-mentioned aspect of the present invention, when forming the opening (opening forming portion) in the base, even if a force to deform the substrate body is exerted at the portion where the opening is formed due to stress generated by a difference in materials between the base and the substrate body, the reinforcing member is provided at the portion corresponding to the opening in a step prior to the step of forming the opening. Hence, it is possible to prevent the substrate body from being deformed at the portion where the opening is formed.

Additionally, in the above-mentioned manufacturing method of a substrate, the step of manufacturing the reinforcing member may include a step of forming a capacitor on a core member.

Accordingly, by making the step of manufacturing the reinforcing member include the step of forming the capacitor on the core member, it is possible to use the reinforcing member as a circuit board having the capacitor.

Additionally, the step of manufacturing the reinforcing member may include a step of forming a via penetrating the core member.

Accordingly, by making the step of manufacturing the reinforcing member include the step of forming a via penetrating the core member, it is possible to use the reinforcing member as an interposer having the via.

Additionally, the reinforcing member may be arranged on the base via an abutting member made of a metal.

Accordingly, since the reinforcing member is arranged on the base via the abutting member made of the metal, heat generated in the semiconductor element is transferred to the base via the reinforcing member and the abutting member made of the metal. Hence, it is possible to increase the heat radiation efficiency of the semiconductor element.

According to another aspect of the present invention, a semiconductor device may include:

the above-mentioned semiconductor device substrate; and a semiconductor element mounted in the opening forming portion of the semiconductor device substrate.

According to the above-mentioned aspect of the present invention, the substrate body is not deformed in the vicinity of the opening (opening forming portion) of the semiconductor device substrate. Hence, it is possible to mount the semiconductor element on the semiconductor device substrate with a high degree of accuracy, and increase reliability of the semiconductor device.

Other objects, features and advantages of the present invention will become more apparent from the following detailed description when read in conjunction with the following drawings.

BRIEF DESCRIPTION OF THE DRAWINGS

FIGS. 5A, 5B, 5C and 5D are schematic diagrams showing variations of the circuit board of the first embodiment;

DETAILED DESCRIPTION OF THE PREFERRED EMBODIMENTS

A description is given below of preferred embodiments of the present invention, with reference to the drawings.

Figure 1:
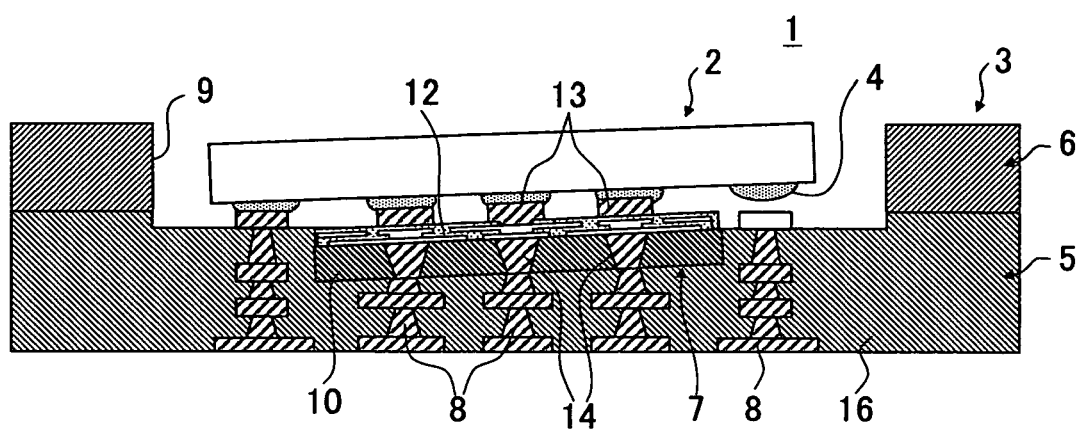
FIG. 1 is a cross-sectional view of a conventional semiconductor device and a conventional semiconductor device substrate.
Figure 2A:
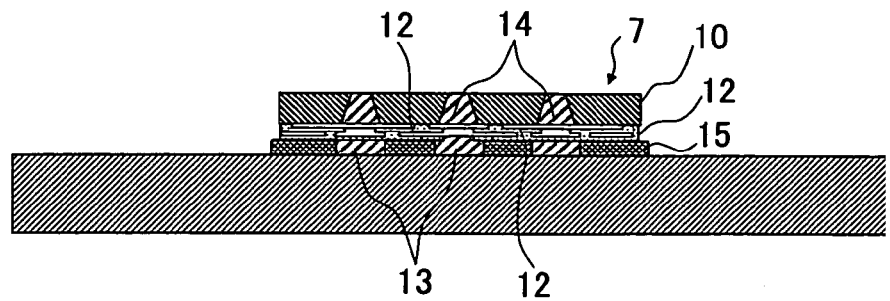
FIGS. 2A, 2B and 2C are cross-sectional views for explaining a conventional manufacturing method of the semiconductor device substrate.
Figure 2B:
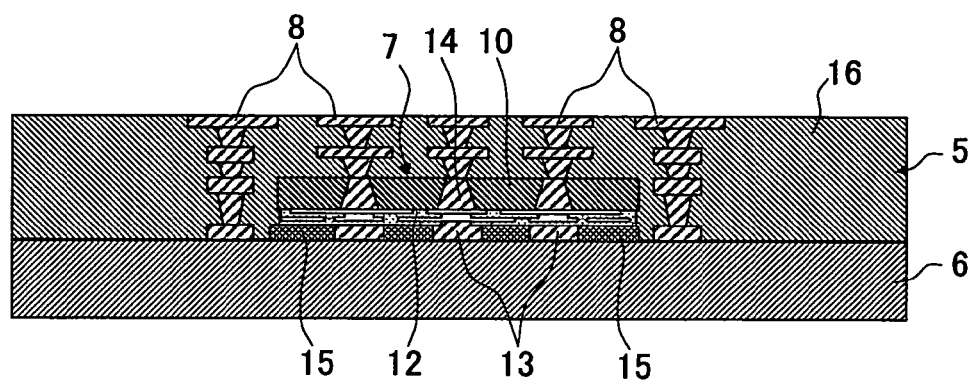
Figure 2C:
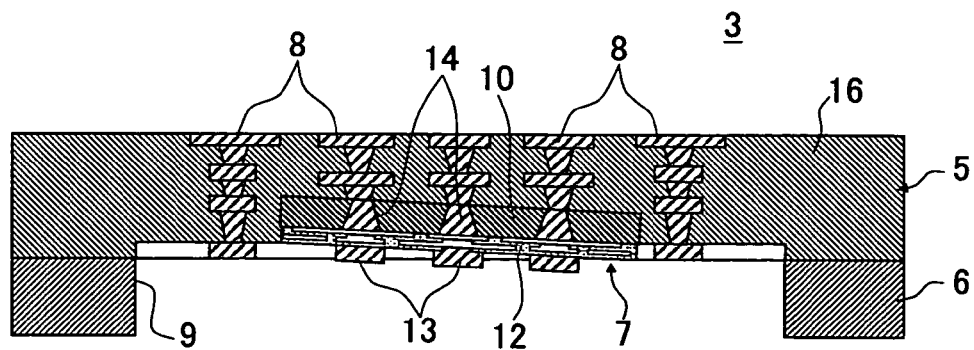
Figure 3:
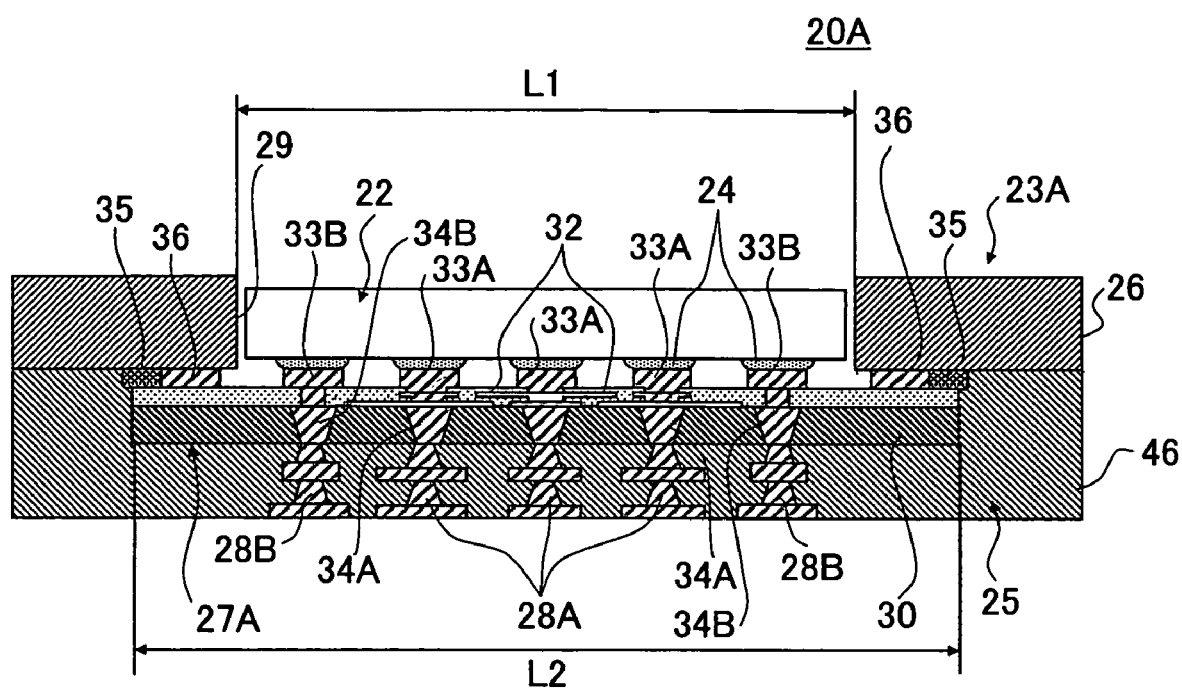
FIG. 3 is a cross-sectional view of a semiconductor device and a semiconductor device substrate according to a first embodiment of the present invention.

FIG. 3 shows a semiconductor device 20A and a semiconductor device substrate 23A (a substrate 23A for a semiconductor device, hereinafter simply referred to as a "substrate 23A") according to a first embodiment of the present invention. The semiconductor device 20A generally includes the substrate 23A and a semiconductor element 22 mounted in an opening (opening forming portion) 29 formed in the substrate 23A.

The substrate 23A includes a substrate body 25, a base 26, and a circuit board 27A, for example. The substrate body 25 is formed on one side of the base 26 by a build-up method. Power supply/ground vias 28A, signal vias 28B, and a wiring pattern (not shown), which serve as wiring layers, are formed in an insulating resin member 46. Each of the vias 28A and 28B is formed to penetrate the insulating resin member 46 in the longitudinal direction of FIG. 3.

A power supply electrode and a ground electrode of a semiconductor element 22 are arranged in the center portion of the semiconductor element 22 as mentioned above. Hence, the power supply/ground vias 28A connected to the power supply electrode and the ground electrode of the semiconductor element 22 via the circuit board 27A are arranged at positions corresponding to the center portion of the circuit board 27A. On the other hand, the signal vias 28B connected to signal electrodes of the semiconductor element 22 are arranged at positions more distant from the center of the circuit board 27A than the positions of the power supply/ground vias 28A.

It should be noted that the bottom portions of the vias 28A and 28B serve as terminals for external connection. That is, the semiconductor device 20A according to this embodiment has a LGA (Land Grid Array) type package structure.

The base 26 is provided for supporting the substrate body 25. Thus, the base 26 is formed by a metal (copper, for example) having a mechanical strength higher than that of the insulating resin member 46, which is the main material of the substrate body 25. The opening 29 is formed in the base 26 at the position where the semiconductor element 22 is mounted.

A description is given below of the circuit board 27A. As shown in FIG. 3 and in FIG. 4 in an enlarged manner, the circuit board 27A includes a silicon core 30, capacitor parts 32, power supply/ground bumps 33A and signal bumps 33B, power supply/ground core penetrating vias (power supply/ground vias) 34A, signal core penetrating vias (signal vias) 34B, and dummy bumps 36, for example. The circuit board 27A is mounted on the substrate body 25 with a part of the circuit board 27A embedded in the substrate body 25.

Figure 4:
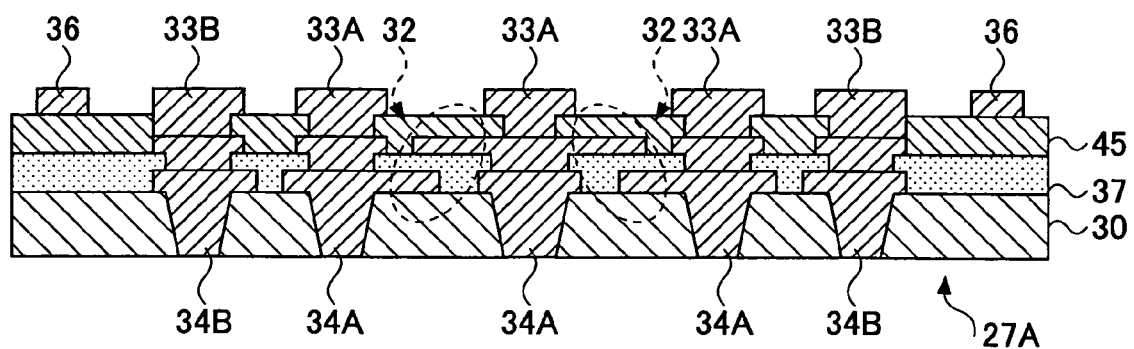
FIG. 4 is an enlarged cross-sectional view of the semiconductor device and a circuit board mounted in the semiconductor device substrate of the first embodiment.

A plurality of through-holes penetrating silicon core 30 in the vertical direction in FIG. 4 are formed in the silicon core 30. By providing copper in the through-holes, the power supply/ground vias 34A and the signal vias 34B are formed. The power supply/ground vias 34A are arranged in the center portion of the silicon core 30 so as to correspond to the positions of the power supply/ground electrodes formed in the semiconductor element 22. On the other hand, the signal vias 34B are arranged at positions more distant from the center portion of the silicon core 30 than the positions of the electrode/ground vias 34A so as to correspond to the signal electrodes formed in the semiconductor element 22.

A dielectric layer 37 is formed on the top surface of the silicon core 30. The power supply/ground bumps 33A and the signal bumps 33B are formed on the top surface of the dielectric layer 37. Thus, the dielectric layer 37 is arranged between the bumps (the power supply/ground bumps 33A and the signal bumps 33B) and the vias (the electrode/ground vias 34A and the signal vias 34B). In addition, a protective film 45 is formed on the top of the dielectric layer 37. The power supply/ground bumps 33A and the signal bumps 33B are exposed at the protective film 45.

The power supply/ground bumps 33A are arranged in the center portion of the dielectric layer 37 so as to correspond to the positions of the power supply/ground electrodes formed in the semiconductor element 22. On the other hand, the signal bumps 33B are arranged at positions more distant from the center portion of the dielectric layer 37 than the positions of the power supply/ground bumps 33A so as to correspond to the positions of the signal electrodes formed in the semiconductor element 22. The power supply/ground electrodes of the semiconductor element 22 are flip-chip bonded to the power supply/ground bumps 33A and the signal bumps 33B via solder bumps 24.

The capacitor parts 32, which function as capacitors, are formed in the dielectric layer 37. The capacitor parts 32 are connected to the power supply/ground bumps 33A and the power supply/ground vias 34A. The capacitor parts 32 are configured to function as decoupling capacitors when the semiconductor element 22 is mounted on the substrate 23A and operated. Hence, with the capacitor parts 32, it is possible to stabilize power supply voltage supplied to the semiconductor element 22, and increase reliability of the semiconductor device 20A.

In addition, the capacitor parts 32 are arranged at the positions beneath the semiconductor element 22. Thus, the distances of conductive channels between the semiconductor element 22 and the capacitor parts 32 are short, and the inductances L thereof are small. Accordingly, even if the operating frequency of the semiconductor element 22 is increased, it is possible to stably supply the power supply voltage to the semiconductor element 22 without being affected by the inductances L.

It should be noted that the capacitor parts 32 are not formed between the signal bumps 33B and the signal vias 34B. Thus, the signal bumps 33B and the signal vias 34B serve only as interposers connecting the semiconductor element 22 and the signal vias 28B.

The dummy bumps 36, which serve as bonding members, are formed on the top surface of the circuit board 27A (specifically, on the top surface of the protective film 45) at positions more distant from the center portion of the circuit board 27A than the positions of the power supply/ground bumps 33A and the signal bumps 33B (refer to FIG. 5A). The dummy bumps 36 are explained later for convenience of explanation.

A more detailed description is given below of the circuit board 27A and the opening 29 formed in the base 26.

As shown in FIG. 3, the circuit board 27A is configured to have a flat shape (surface) larger than the opening 29 formed in the base 26. Referring to the cross-sectional shape of the circuit board 27A shown in FIG. 3, a length L2 of the circuit board 27A in the horizontal direction in FIG. 3 is set longer than a length L1 of the semiconductor element 22 in the horizontal direction in FIG. 3 (L2>L1). That is, as shown in FIG. 5A, the circuit board 27A is configured to have an area larger than that of a region (hereinafter referred to as an "opening region 38A") corresponding to the opening 29.

Accordingly, when the circuit board 27A is mounted in the semiconductor device 20A, a region (hereinafter this region is referred to as an "overlapping region") 38B of the circuit board 27A outside the opening region 38A overlaps the base 26. The dummy bumps 36 are formed in the overlapping region 38B.

By making the circuit board 27A larger than the opening 29 formed in the base 26 as in this embodiment, the dummy bumps 36 abut the base 26, and the circuit board 27A is thus supported by the base 26. The mechanical strength of the silicon core 30, which is a base material of the circuit board 27A, is higher than that of the insulating resin member 46, which is the main material of the base 26.

Accordingly, even if the opening 29 is formed in the base 26, it is possible to reinforce the substrate body 25 at the portion (hereinafter referred to as an "opening corresponding portion") including the portion facing the opening 29 (corresponding to the opening region 38A) and the portion close to the opening 29 which positions are affected by the above-mentioned stress. That is, the circuit board 27A serves as a reinforcing member that reinforces the opening corresponding position. Hence, by providing the circuit board 27A having the above-mentioned configuration, it is possible to prevent the substrate body 25 from being deformed at the opening corresponding position.

In addition, since it is possible to prevent the substrate body 25 from being deformed as mentioned above, the circuit board 27A is not inclined in the substrate body 25. Accordingly, it is possible to positively electrically connect the semiconductor element 22 and the circuit board 27A, and it is possible to increase reliability in mounting the semiconductor element 22 on the circuit board 27A.

Additionally, in this embodiment, the circuit board 27A having the capacitor parts 32 for stabilizing power supply to the semiconductor element 22 is used as the reinforcing member for the opening 29. Hence, it is possible to reduce the number of components compared to the case where the circuit board 27A and a reinforcing member for the opening 29 are separately provided.

Further, the dummy bumps 36 have a heat transfer effect that transfers heat generated in the semiconductor element 22. That is, by providing the dummy bumps 36, heat generated in the semiconductor element 22 is transferred to the base 26 via the dummy bumps 36 and the circuit board 27A. On this occasion, since the semiconductor element 22 and the circuit board 27A are arranged in the vicinity as mentioned above, good heat conduction from the semiconductor element 22 to the circuit board 27A is performed. Hence, it is possible to increase the heat radiation efficiency of the semiconductor element 22.

As shown in FIGS. 3, 4 and 5A, in the semiconductor device 20A according to the first embodiment, the dummy bumps 36 are used as bonding members that bond the circuit board 27A to the base 26. The dummy bumps 36 are arranged in the overlapping region 38B such that the dummy bumps 36 surround the opening region 38A in a dotted manner around the circumference in a single layer. However, the configuration of the bonding members is not limited to the above-mentioned configuration.

For example, as in the circuit board 27B shown in FIG. 5B, the dummy bumps 36 may be arranged in the overlapping region 38B such that the dummy bumps surround the opening region 38A in a dotted manner in two layers. The dummy bumps 36 may be arranged in three or more layers. With such a configuration, compared to the circuit board 27A on which the dummy bumps 36 are arranged in one layer, it is possible to more firmly bond the circuit board 27B to the base 26.

The bonding members are not limited to the dummy bumps 36 arranged in a dotted manner. As shown in FIG. 5C, a frame bonding member 39, which surrounds the opening region 38A, may be arranged in the overlapping region 38B. In addition, as shown in FIG. 5D, two frame bonding members 39 may be arranged in the overlapping region 38B. Further, three or more frame bonding members 39 may be arranged.

The semiconductor device 20A shown in FIG. 3 has the LGA type package structure in which the power supply/ground vias 28A and the signal vias 28B are exposed at the bottom surface of the substrate body 25 to form terminals for external connection. However, the semiconductor device 20A may have a BGA (Ball Grid Array) type package structure by arranging solder balls, which serve as terminals for external connection, under the power supply/ground vias 28A and the signal vias 28B.

Figure 6A:
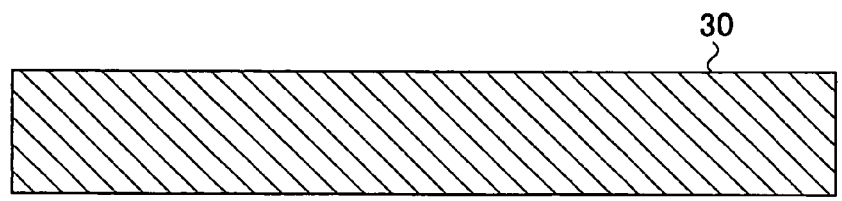
FIGS. 6A, 6B and 6C are schematic diagrams for explaining a manufacturing method of the semiconductor device substrate according to the first embodiment of the present invention.
Figure 6B:
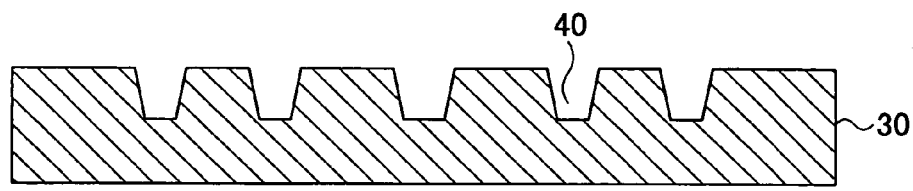

Referring to FIGS. 6 through 9, a description is given below of a manufacturing method of the substrate 23A having the above-mentioned configuration. When manufacturing the substrate 23A, first, the circuit board 27A is manufactured. FIGS. 6 through 8 show a manufacturing method of the circuit board 27A.

As shown in FIG. 6A, when manufacturing the circuit board 27A, first, a block silicon core 30 is prepared. Concave portions 40 for forming the power supply/ground vias 28A and the signal vias 28B are formed in the silicon core 30. The formation of the concave portions 40 is performed by, for example, etching. When the concave portions 40 are formed, an insulating layer (not shown) having a predetermined thickness is formed on a surface of the silicon core 30 where the concave portions 40 are formed by a thermal oxidation process, for example.

Figure 6C:
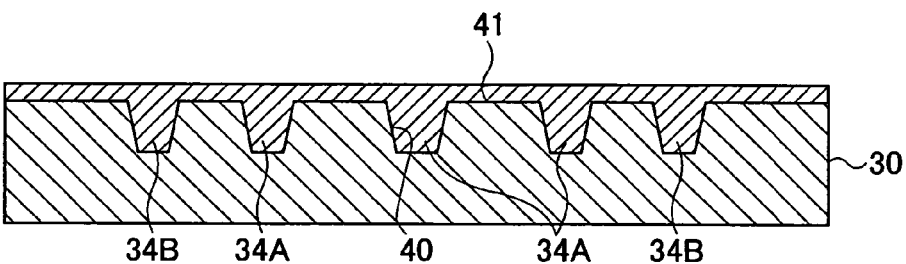

When the concave portions 40 and the insulating film are formed in the silicon core 30, plating is subsequently performed, thereby forming a first copper layer 41 that fills the concave portions 40 and has a predetermined thickness on a surface of the silicon core 30. By forming the copper layer 41 in the concave portions 40, the power supply/ground vias 34A and the signal vias 34B are formed. FIG. 6C shows a state where the first copper layer 41 is formed in the silicon core 30.

Figure 7A:
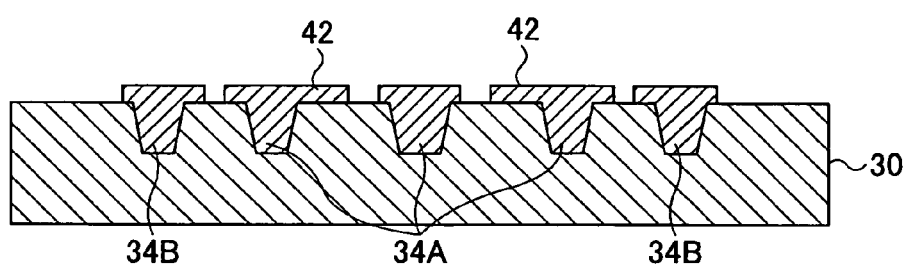
FIGS. 7A, 7B and 7C are schematic diagrams continued from FIG. 6C for explaining the manufacturing method of the semiconductor device substrate according to the first embodiment of the present invention.

Subsequently, patterning is performed on the first copper layer 41 formed on the silicon core 30. Consequently, as shown in FIG. 7A, lower electrode parts 42 are formed with respect to predetermined power supply/ground vias 34A. In this embodiment, the lower electrode parts 42 are formed in upper portions of the second and fourth power supply/ground vias 34A when counted from the left. Each of the lower electrode parts 42 extends towards the inner side (toward the third power supply/ground via 34A when counted from the left). The lower electrode parts 42 form a part of the corresponding capacitor parts 32.

Figure 7B:
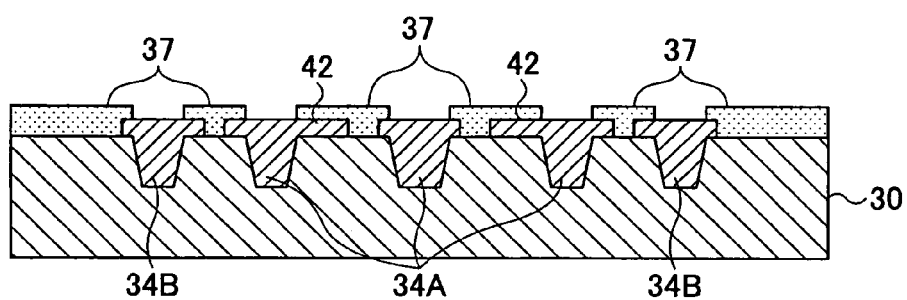

When the lower electrode parts 42 are formed, a tantalum film is subsequently formed over a surface of the silicon core 30 by tantalum sputtering. By patterning the tantalum film and conducting an anodizing process, the dielectric layer 37 having a predetermined shape, which is shown in FIG. 7B, is formed. The dielectric layer 37 is configured to be formed on upper portions of the lower electrode parts 42.

Figure 7C:
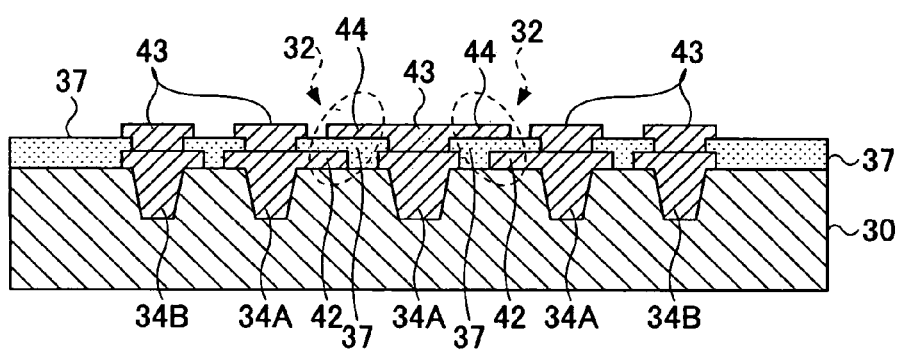

When formation of the dielectric layer 37 is completed, a copper layer is formed over a surface of the silicon core 30 by plating. By patterning the copper layer by etching, a second copper layer 43, which is shown in FIG. 7C, is formed. On this occasion, an upper electrode part 44 is formed on a predetermined power supply/ground via 34A.

In this embodiment, the upper electrode part 44 extending outwardly is formed above the third power supply/ground via 34A when counted from the left. Consequently, the lower electrode parts 42 and the upper electrode part 44 face each other via the dielectric layer 37. Hence, the capacitor parts 32 are formed at the positions surrounded by broken lines in FIG. 7C.

Figure 8A:
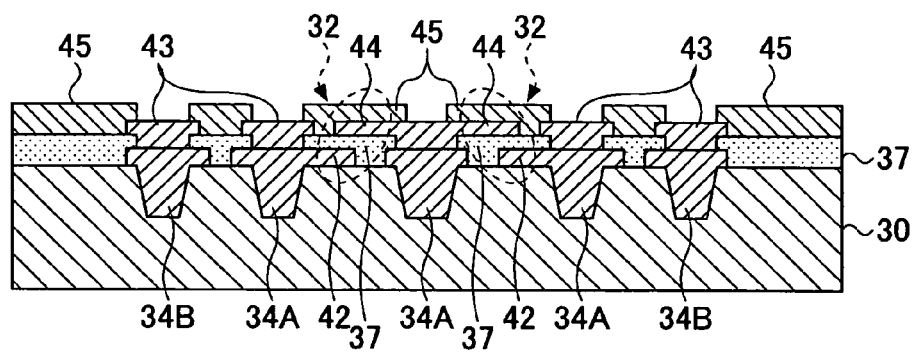
FIGS. 8A, 8B and 8C are schematic diagrams continued from FIG. 7C for explaining the manufacturing method of the semiconductor device substrate according to the first embodiment of the present invention.

When the capacitor parts 32 are formed in the aforementioned manner, the protective film 45 is subsequently formed by forming and patterning an insulating film on a surface of the silicon core 30. FIG. 8A shows a state where the protective film 45 is formed on the silicon core 30. Openings are formed in the protective film 45 at the positions corresponding to the second copper layer 43. Thus, the second copper layer 43 is exposed.

Figure 8B:
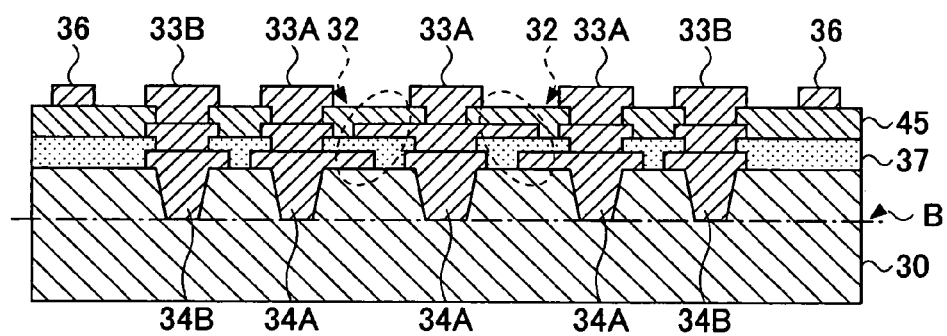

Then, as shown in FIG. 8B, the power supply/ground bumps 33A and the signal bumps 33B are formed on the second copper layer 43 by Cu plating, and the dummy bumps 36 are formed at positions where the dummy bumps 36 are to be formed by Cu plating. Subsequently, surface treatment is performed by Ni/Au plating on the power supply/ground bumps 33A, the signal bumps 33B, and the dummy bumps 36. In the aforementioned manner, the dummy bumps 36 are formed simultaneously with the power supply/ground bumps 33A and the signal bumps 33B. Hence, even if the dummy bumps 36 are provided, the manufacturing process of the circuit board 27A is not complicated.

Figure 8C:
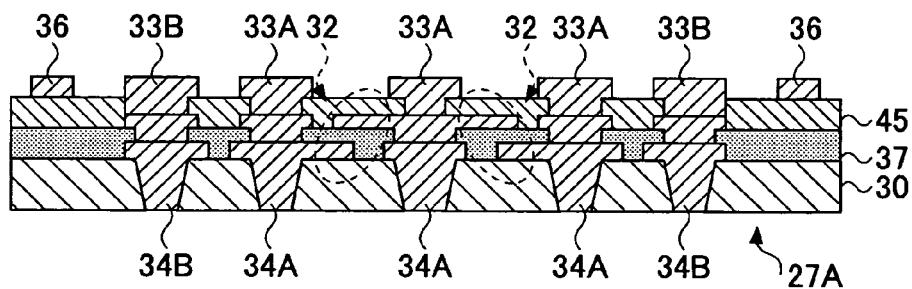

When the power supply/ground bumps 33A, the signal bumps 33B, and the dummy bumps 36 are formed as mentioned above, the back surface of the silicon core 30 is subsequently background to the position indicated by an arrow B in FIG. 8B, i.e., the position at which the power supply/ground vias 34A and the signal vias 34B are exposed. Consequently, as shown in FIG. 8C, the circuit board 27A is manufactured.

When the circuit board 27A is manufactured as mentioned above, subsequently, as shown in FIG. 9A, the circuit board 27A is arranged on the base 26. The base 26 is formed by a metal such as copper as mentioned above, and the opening 29 is not yet formed in the base 26 in this manufacturing process.

An adhesive material 35 is applied to the arranging position of the circuit board 27A in advance, and the circuit board 27A is pressed against the base 26. Accordingly, the power supply/ground bumps 33A, the signal bumps 33B, and the dummy bumps 36 abut the base 26 via the adhesive material 35. A thermosetting resin may be used as the adhesive material 35. Thus, by heating and curing the adhesive material 35, the circuit board 27A is fixed to the base 26.

It should be noted that the method for fixing the circuit board 27A to the base 26 is not limited to the above-mentioned method. Specifically, the circuit board 27A may be fixed to the base 26 by another method in which: the power supply/ground bumps 33A, the signal bumps 33B, and the dummy bumps 36 are formed by solder; pads and dummy pads are formed on the base 26 at the positions corresponding to the power supply/ground bumps 33A, the signal bumps 33B, and the dummy bumps 36; and the power supply/ground bumps 33A, the signal bumps 33B, and the dummy bumps 36 are bonded to the respective pads and dummy bumps by solder bonding. Either method may be used in the manufacturing method according to this embodiment. However, a description is given below of a case where the former method is used.

When the circuit board 27A is fixed to the base 26 as mentioned above, a formation process of the base body 25 is subsequently performed on the base 26. The base body 25 is formed on one side of the base 26 by a build-up method while using the base 26 on which the circuit board 27A is arranged as a core substrate.

Figure 9A:
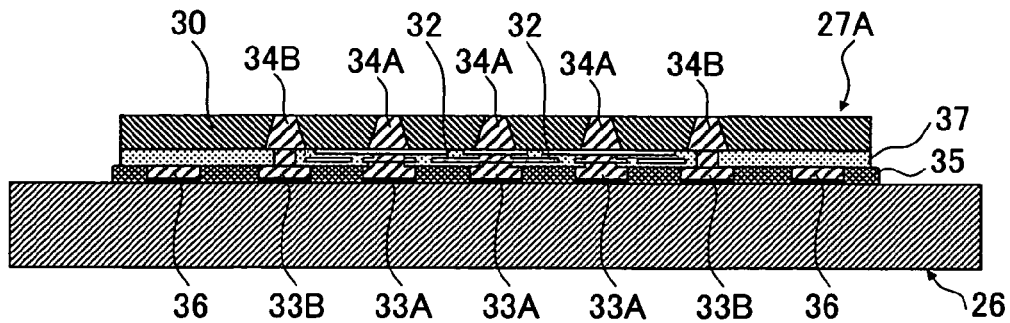
FIGS. 9A, 9B and 9C are schematic diagrams continued from FIG. 8C for explaining the manufacturing method of the semiconductor device substrate according to the first embodiment of the present invention.
Figure 9B:
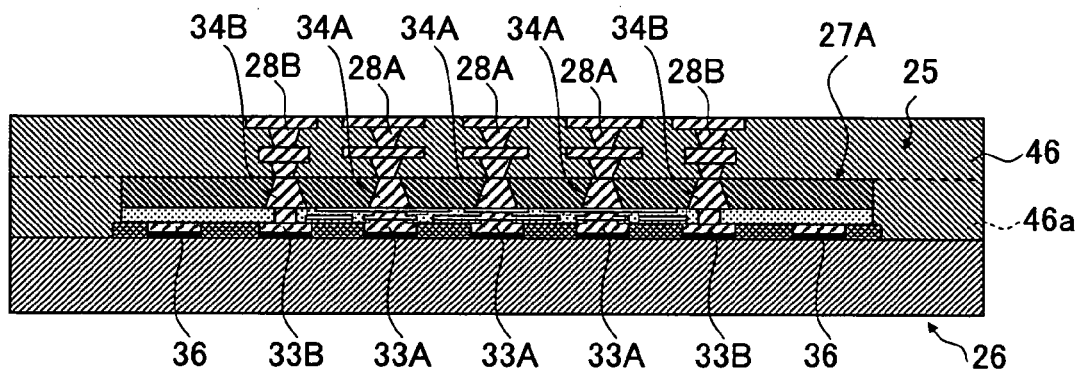

Specifically, in this embodiment, first, the insulating resin member 46a is formed to the height equal to the circuit board 27A. Subsequently, a plurality of build-up layers are formed on the insulating resin member 46a and the circuit board 27A. Consequently, as shown in FIG. 9B, the substrate body 25 is formed on the base 26, and the power supply/ground vias 28A and the signal vias 28B are formed on the power supply/ground vias 34A and the signal vias 34B, respectively. In this embodiment, a case is shown where two build-up layers are formed. However, this is not a limitation of the number of build-up layers.

Figure 9C:
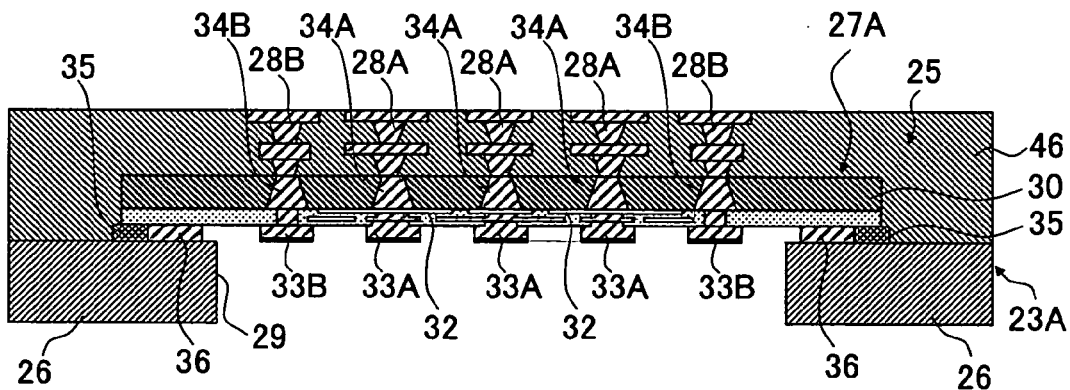

When the substrate body 25 is formed on the base 26 in the aforementioned manner, a resist is subsequently formed on the base 26 except the portion where the opening 29 is formed. An etching process is performed on the base 26 while using the resist as a mask. Consequently, as shown in FIG. 9C, the opening 29 is formed in the base 26.

Additionally, with the above-mentioned etching process, the adhesive material 35, which is used when arranging the circuit board 27A on the base 26, is removed. However, the adhesive material 35 positioned outwardly from the formation positions of the dummy bumps 36 remains even after the formation of the opening 29. Such adhesive material 35 serves to fix the circuit board 27A to the base 26.

As mentioned above, since the material of the base 26 and that of the substrate body 25 are different, stress due to a difference in thermal expansion coefficient is generated between the base 26 and the substrate body 25. Before the opening 29 is formed, deformation of the substrate body 25 is regulated by the base 26, and the substrate 23A is not directly changed. When the opening 29 is formed, however, the substrate body 25 is not supported by the base 26 in the portion where the opening 29 is formed. Thus, as mentioned above, there is a possibility that the substrate body 25 may be deformed by the above-mentioned stress.

However, in the substrate 23A according to this embodiment, the circuit board 27A is configured to be larger than that of the opening 29. Hence, the circuit board 27A serves as a reinforcing member that reinforces the substrate body 25 not only in the portion corresponding to the opening 29 but also in the portion that is in the vicinity of the opening 29.

Accordingly, when forming the opening 29 in the base 26, even if a force to deform the substrate body 25 is exerted on the opening corresponding portion of the substrate body 25 by the stress due to the difference in materials of the base 26 and the substrate body 25, the circuit board 27A serving as the reinforcing member is provided in the opening corresponding portion in the step prior to the step of forming the opening 29. Hence, it is possible to prevent deformation from being caused in the portion where the opening 29 is formed.

Accordingly, it is possible to prevent the circuit board 27A formed in the substrate body 25 from being inclined, and to positively electrically connect the circuit board 27A and the semiconductor element 22 mounted in the opening 29. Hence, adequate electrical connection between the semiconductor element 22 and the substrate 23A is made, and it is possible to improve reliability of the semiconductor device 20A.

Figure 10:
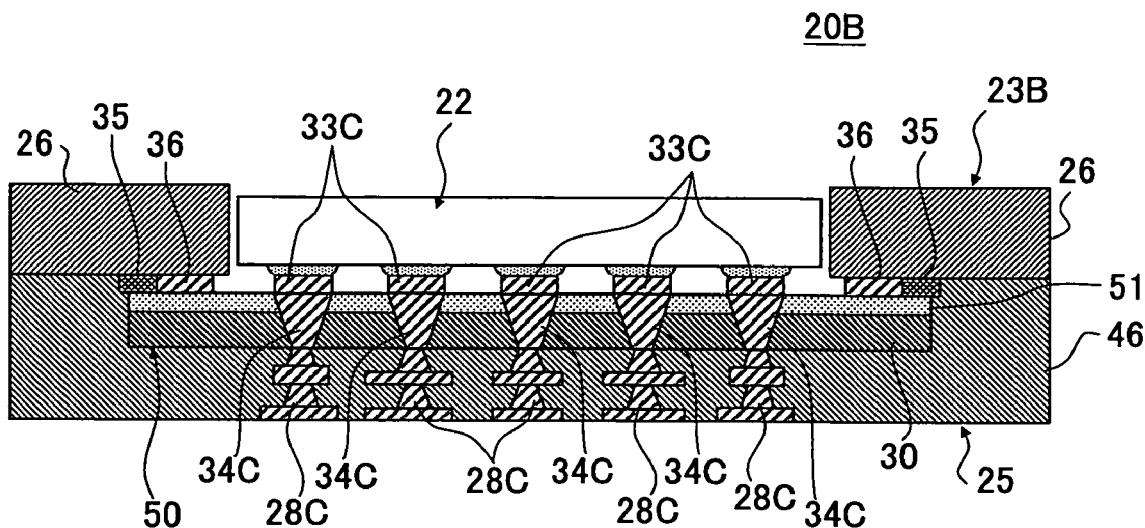
FIG. 10 is a cross-sectional view of a semiconductor device and a semiconductor device substrate according to a second embodiment of the present invention.
Figure 11:
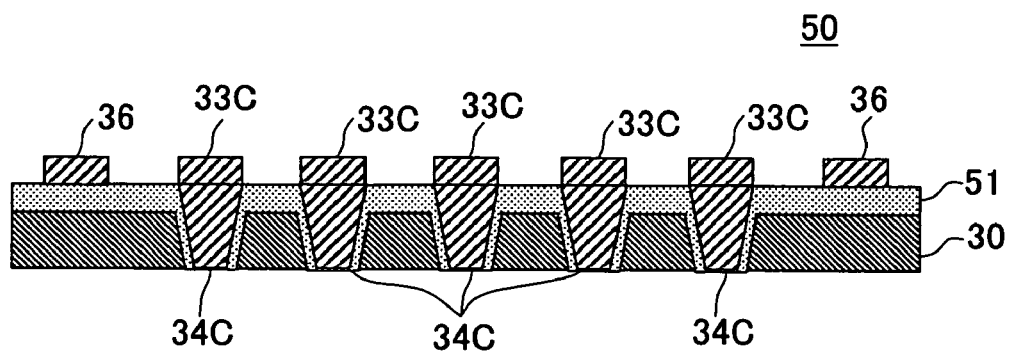
FIG. 11 is an enlarged cross-sectional view of an interposer mounted in the semiconductor device substrate and the semiconductor device according to the second embodiment of the present invention.

FIG. 10 shows a semiconductor device 20B and a substrate 23B according to a second embodiment of the present invention. FIG. 11 shows an interposer 50 provided in the semiconductor device 20B. In FIGS. 10 and 11, those parts that are the same as those corresponding parts in FIGS. 3 through 9C are designated by the same reference numerals, and a description thereof is omitted.

In the above-mentioned first embodiment, the circuit board 27A having the capacitor parts 32 is used as the reinforcing member that reinforces the substrate body 25 when the opening 29 is formed. However, the circuit board 27A having the capacitor parts 32 is not a limitation of the reinforcing member that reinforces the opening corresponding portion.

Therefore, in the semiconductor device 20B according to this embodiment, the interposer 50 is provided instead of the circuit board 27A having the capacitor parts 32. As shown in FIG. 11 in an enlarged manner, the interposer 50 includes the silicon core 30, bumps 33C, core penetrating vias 34C, and the dummy bumps 36.

The bumps 33C and the core penetrating vias 34C are directly connected. An insulating film 51 is a resin film or a silicon oxide film having an insulative property. Different from the first embodiment, the capacitor parts 32 are not formed.

Similar to the circuit board 27A according to the first embodiment, the interposer 50, which is provided in the substrate 23B (semiconductor device 20B) according to the second embodiment, is configured to have a shape larger than the opening 29 (to have an area larger than that of the opening 29 with a bird's eye view) and to be arranged such that the opening 29 overlaps the interposer 50. The dummy bumps 36 are arranged in a periphery portion of the interposer 50, and the dummy bumps 36 abut the base 26.

Accordingly, similar to the circuit board 27A according to the first embodiment, the interposer 50 according to the second embodiment serves as a reinforcing member that reinforces the opening corresponding portion of the substrate body 25. Hence, the substrate body 25 is not deformed even if the opening 29 is formed, and the interposer (reinforcing member) 50 is not inclined.

Thus, when the semiconductor element 22 is mounted in the opening 29, it is possible to positively connect the semiconductor element 22 and the interposer 50. In addition, by using the interposer 50 as the reinforcing member, it is possible to reduce the number of components compared to the case where an interposer and a reinforcing member are separately provided.

In the first embodiment, the power supply/ground bumps 33A, the signal bumps 33B, and the dummy bumps 36 are arranged on the circuit board 27A in the portion where the semiconductor element 22 is mounted. Additionally, in the second embodiment, the bumps 33C and the dummy bumps 36 are arranged on the interposer 50 in the portion where the semiconductor element 22 is mounted. However, the electrodes formed in the portion where the semiconductor element 22 is mounted are not always limited to the bumps, and may be pads.

Further, in the first and second embodiment, the silicon core 30 is used as the core of the circuit board 27A and the interposer 50, respectively. However, the material of the core is not limited to silicon, and other materials such as glass and ceramics may be used.

According to the present invention, it is possible to achieve various effects as follows.

In an embodiment of the present invention, the substrate body 25 is reinforced by the reinforcing member 27A (50) in the position corresponding to the opening 29. Hence, it is possible to prevent the substrate body 25 from being deformed at the position corresponding to the opening 29.

In an embodiment of the present invention, by using as the reinforcing member the circuit board 27A having the capacitor part therein that electrically connects the semiconductor element 22 and the wiring layer, when the semiconductor element 22 is mounted in the opening 29, the circuit board (reinforcing member) 27A is not inclined since the substrate body 25 is not deformed. Thus, it is possible to positively connect the semiconductor element 22 and the circuit board 27A. In addition, by using the circuit board 27A as the reinforcing member, it is possible to reduce the number of components compared to the case where the circuit board 27A and a reinforcing member are separately provided.

In an embodiment of the present invention, by using as the reinforcing member the interposer 50 having the vias 34C that directly electrically connects the semiconductor element 22 and the wiring layer, when the semiconductor element 22 is mounted in the opening 29, the interposer (reinforcing member) 50 is not inclined since the substrate body 25 is not deformed. Thus, it is possible to positively connect the semiconductor element 22 and the interposer 50. In addition, by using the interposer 50 as the reinforcing member, it is possible to reduce the number of components compared to the case where the interposer 50 and a reinforcing member are separately provided.

In an embodiment of the present invention, since the reinforcing member (27A, 50) is arranged on the base 26 via the abutting member (36) made of a metal, heat generated in the semiconductor element 22 is transferred to the base 26 via the reinforcing member (27A, 50) and the abutting member (36) made of the metal. Hence, it is possible to increase the heat radiation efficiency of the semiconductor element 22.

In an embodiment of the present invention, when forming the opening (opening forming portion) 29 in the base 26, even if a force to deform the substrate body 25 is exerted at the position where the opening 29 is formed due to stress generated by a difference in materials between the base 26 and the substrate body 25, the reinforcing member (27A, 50) is provided at the position corresponding to the opening 29 in a step prior to the step of forming the opening 29. Hence, it is possible to prevent the substrate body 25 from being deformed at the position where the opening 29 is formed.

In an embodiment of the present invention, by making the step of manufacturing the reinforcing member (27A) include the step of forming the capacitor on the core member, it is possible to use the reinforcing member (27A) as a circuit board having the capacitor.

In an embodiment of the present invention, by making the step of manufacturing the reinforcing member (50) include the step of forming the vias 34C penetrating the core member, it is possible to use the reinforcing member (50) as an interposer having the vias 34C.

In an embodiment of the present invention, since the reinforcing member (27A, 50) is arranged on the base 26 via the abutting member (36) made of the metal, heat generated in the semiconductor element 22 is transferred to the base 26 via the reinforcing member (27A, 50) and the abutting member (36) made of the metal. Hence, it is possible to increase the heat radiation efficiency of the semiconductor element 22.

In an embodiment of the present invention, the substrate body 25 is not deformed in the vicinity of the opening (opening forming portion) 29 of the semiconductor device substrate 23A. Hence, it is possible to mount the semiconductor element 22 on the semiconductor device substrate 23A with a high degree of accuracy, and increase reliability of the semiconductor device 20A (20B).

The present invention is not limited to the specifically disclosed embodiments, and variations and modifications may be made without departing from the scope of the present invention.

The present application is based on Japanese priority application No. 2003-72755 filed on Mar. 17, 2003, the entire contents of which are hereby incorporated by reference.

What is claimed is:

1. A semiconductor device substrate, comprising:
a substrate body having a wiring layer;
a base formed by a material that is different from a material of said substrate body, supporting said substrate body, and having an opening forming portion where a semiconductor element is mounted; and
a reinforcing member having two surfaces and sides,
wherein the surface areas of the reinforcing member are larger than the opening forming portion,
wherein the sides and one surface area of the reinforcing member are embedded in said substrate body at a portion corresponding to the opening forming portion such that only a portion of the unembedded surface is exposed through the opening forming portion, and
a semiconductor element mounted on the surface of the reinforcing member exposed through the opening forming portion.

2. The semiconductor device substrate as claimed in claim 1, wherein the reinforcing member is a circuit board having a capacitor part that electrically connects the semiconductor element and the wiring layer.

3. The semiconductor device substrate as claimed in claim 2, wherein the reinforcing member is arranged on the base via an abutting member made of a metal.

4. The semiconductor device substrate as claimed in claim 1, wherein the reinforcing member is an interposer having a via that directly electrically connects the semiconductor element and the wiring layer.

5. The semiconductor device substrate as claimed in claim 4, wherein the reinforcing member is arranged on the base via an abutting member made of a metal.

6. The semiconductor device substrate as claimed in claim 1, wherein the reinforcing member is arranged on the base via an abutting member made of a metal.

7. A manufacturing method of a substrate, said manufacturing method comprising the steps of:
manufacturing a reinforcing member having two surfaces and sides;
arranging the reinforcing member on a base at a portion corresponding to an opening forming portion of the base. wherein the surface areas of the reinforcing member are larger than the opening forming portion;
forming a substrate body on the base on which the reinforcing member is arranged so that the reinforcing member is provided in said substrate, said substrate body including a wiring layer and made of a material that is different from a material of the base,
wherein the sides and one surface area of the reinforcing member are embedded in said substrate body at a portion corresponding to the opening forming portion such that only a portion of the unembedded surface is exposed throuph the opening forming portion
mountin a semiconductor element on the surface of the reinforcing member exposed through the opening forming portion.

8. The manufacturing method as claimed in claim 7, wherein the step of manufacturing the reinforcing member includes a step of forming a capacitor on a core member.

9. The manufacturing method as claimed in claim 7, wherein the step of manufacturing the reinforcing member includes a step of forming a via penetrating the core member.

10. The manufacturing method as claimed in claim 9, wherein the reinforcing member is arranged on the base via an abutting member made of a metal.

11. The manufacturing method as claimed in claim 8, wherein the reinforcing member is arranged on the base via an abutting member made of a metal.

12. The manufacturing method as claimed in claim 7, wherein the reinforcing member is arranged on the base via an abutting member made of a metal.

13. A semiconductor device comprising:
a substrate body having a wiring layer;
a base formed by a material that is different from a material of said substrate body, supporting said substrate body, and having an opening forming portion where a semiconductor element is mounted; and
a reinforcing member having two surfaces and sides,
wherein the surface areas of the reinforcement member are larger than the opening forming portion,
wherein the sides and one surface area of the reinforcing member are embedded in said substrate body at a portion corresponding to the opening forming portion such that only a portion of the unembedded surface is exposed through the opening forming portion, and a semiconductor element mounted on the surface of the reinforcing member exposed through the opening forming portion.

14. A semiconductor device of claim 13, wherein the reinforcing member is a circuit board having a capacitor part that electrically connects the semiconductor element and the wiring layer.

15. A semiconductor device of claim 14, wherein the reinforcing member is arranged on the base via an abutting member made of a metal.

16. A semiconductor device of claim 13 wherein the reinforcing member is an interposer having a via that directly electrically connects the semiconductor element and the wiring layer.

17. A semiconductor device of claim 16, wherein the reinforcing member is arranged on the base via an abutting member made of a metal.

18. A semiconductor device of claim 13, wherein the reinforcing member is arranged on the base via an abutting member made of a metal.

* * * * *